United States Patent
Kirkpatrick et al.

(10) Patent No.: US 7,968,443 B2
(45) Date of Patent: Jun. 28, 2011

(54) CROSS-CONTAMINATION CONTROL FOR PROCESSING OF CIRCUITS COMPRISING MOS DEVICES THAT INCLUDE METAL COMPRISING HIGH-K DIELECTRICS

(75) Inventors: Brian K. Kirkpatrick, Allen, TX (US); James J. Chambers, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 396 days.

(21) Appl. No.: 12/344,360

(22) Filed: Dec. 26, 2008

(65) Prior Publication Data

US 2010/0167517 A1 Jul. 1, 2010

(51) Int. Cl.
*H01L 21/3205* (2006.01)

(52) U.S. Cl. ......... 438/591; 438/261; 438/691; 438/745

(58) Field of Classification Search .................. 438/216, 438/261, 591, 690, 745, 754, 691; 257/E21.309
See application file for complete search history.

(56) References Cited

U.S. PATENT DOCUMENTS

| 6,455,330 B1 | 9/2002 | Yao et al. | |
| 7,927,993 B2 * | 4/2011 | Kirkpatrick | 438/591 |
| 2005/0176604 A1 | 8/2005 | Lee et al. | |

OTHER PUBLICATIONS

Jeon, J, et al. "Performance of Nitrided Hf Silicate High k Gate Duelectrics." [online] Advanced Process Development, AMD [retrieved on Dec. 26, 2008] retrieved from the Internet: <www.electrochem.org/dl/ma/203/pdfs/0948.pdf>.

* cited by examiner

*Primary Examiner* — Thanhha Pham
(74) *Attorney, Agent, or Firm* — Wade J. Brady, III; Frederick J. Telecky, Jr.

(57) ABSTRACT

A cross method for fabricating a CMOS integrated circuit (IC) includes providing a semiconductor wafer having a topside semiconductor surface, a bevel semiconductor surface, and a backside semiconductor surface, wherein the bevel semiconductor surface and backside semiconductor surface include silicon or germanium. A metal including high-k gate dielectric layer is formed on at least the topside semiconductor surface and on at least a portion of the bevel semiconductor surface and backside semiconductor surface. The high-k dielectric material on the bevel semiconductor surface and the backside semiconductor surface are selectively removed while protecting the high-k dielectric layer on the topside semiconductor surface. The selective removing includes a first oxidizing treatment, and a fluoride including wet etch follows the first oxidizing treatment. The fabrication of the IC is completed including forming at least one metal gate layer on the high-k gate dielectric layer after the selectively removing step.

17 Claims, 2 Drawing Sheets

CROSS-CONTAMINATION CONTROL FOR PROCESSING OF CIRCUITS COMPRISING MOS DEVICES THAT INCLUDE METAL COMPRISING HIGH-K DIELECTRICS

BACKGROUND

Embodiments of the present invention relate to integrated circuits (ICs), and, more particularly, to cleaning processes to control contamination from metal comprising gate dielectrics and fabrication methods for ICs.

Conventional methods of creating CMOS devices use gate electrodes comprising polysilicon that is deposited and patterned over a layer of gate oxide. With the continued decrease in device dimensions, the gate length for sub-micron devices has been decreased to 0.25 μm or less. As gate dielectrics are reduced to this thickness and beyond, a practical and theoretical limit is being approached to the thermal oxidation of a silicon surface for the formation of a layer of gate oxide. In order to meet this challenge, the semiconductor industry is developing materials that can be used as replacement of the thermal oxides that are typically used for the gate dielectric layer.

For example, for gate electrodes that are created with a layer of gate dielectric having an equivalent oxide thickness (EOT) of 14 Angstroms, the leakage current of the gate dielectric, typically comprising a silicon oxide or oxynitride layer, is in generally in excess of 10 $A/cm^2$. This results in high power consumption of the gate electrode and concerns of gate dielectric reliability, thus having a serious negative impact on the electrical performance of the gate electrode. For this reason, high-k metal oxide materials have begun replacing the thermal oxide gate dielectrics. Since the dielectric constant of most metal oxide materials is higher than the dielectric constant of thermally grown oxide, a thicker layer of metal oxide can be deposited while still achieving the required a value of EOT that is comparable to the EOT value of a thinner layer of thermal gate oxide material. The thicker layer of metal oxide for the gate dielectric reduces the gate-to-channel leakage current without having a negative impact on CMOS device performance and is therefore generally advantageous.

However, the high-k metal oxide material is deposited relatively early in the process, being deposited before gate electrode (gate electrode, barrier metal and gate electrode filler) processing. This early portion of the process flow has historically been without any metal comprising layers. Having all non-metal layers generally allows the same processing tools to be used for a wide variety of processing steps, generally without processing restrictions. However, the introduction of high-k materials for use as the gate dielectric has complicated this situation since many of these materials comprise a metal, thus requiring separate processing tools for processing wafers having metal comprising gate dielectrics layers and wafers having all non-metal comprising layers to avoid or at least limit metal cross-contamination. Dedicated processing tools for wafers having non-metal comprising layers and wafers having metal comprising layers increases final die cost by requiring more processing tools, and an increase in required floor space for the added tools.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the invention describe methods for removing a high-k metal comprising dielectric material from the back surface, bevel, and typically the exclusion ring of a wafer. By removing the high-k metal comprising dielectric material sufficient to reduce the concentration below the specification limit for residual metal from the back surface and bevel of the wafer, segregating many of the process tools needed in this portion of the process flow can be avoided. This removal capability thus saves costs by avoiding the need for certain otherwise needed major capital purchases.

The Present Inventors have found metal semiconductor arrangements (e.g. silicides in the case of silicon and refractory metals) can form on exposed semiconductor surfaces during subsequent metal gate deposition processing, such as the metal gate electrode and barrier metal processing. In another embodiment of the invention, following removal of the high-k metal comprising dielectric material from the back surface and bevel of a wafer, an oxide comprising passivation layer is formed on the backside and bevel surfaces of the wafer to passivate these surfaces to avoid or at least limit adherence of difficult to remove metal semiconductor arrangements, such as silicides. In one embodiment of the invention, the same spray etch tool is used in sequential in-situ processing to remove the high-k metal comprising dielectric material and then form the passivation layer on the backside and bevel surfaces of the wafer.

DETAILED DESCRIPTION

Figure 1:
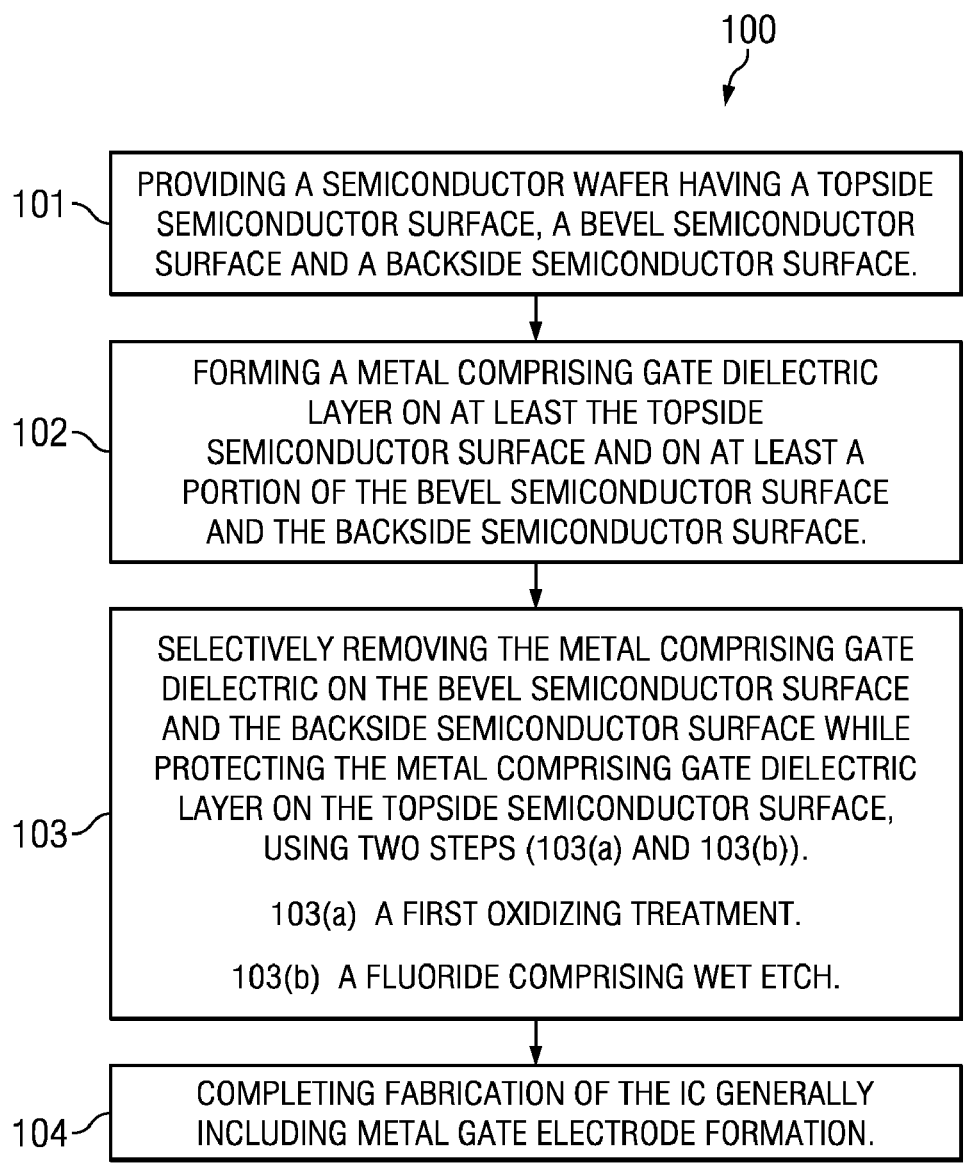
FIG. 1 shows a flow diagram for a first method for fabricating a CMOS integrated circuit (IC) including removing a high-k metal comprising dielectric material from the back semiconductor surface and bevel semiconductor surface of a wafer, according to a first embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 shows a flow diagram for a first method 100 for fabricating a CMOS integrated circuit (IC) including removing a high-k metal comprising dielectric material from the back semiconductor surface, bevel semiconductor surface and generally the edge exclusion of a wafer, according to a first embodiment of the invention. Step 101 comprises providing a semiconductor wafer having a topside semiconductor surface, a bevel semiconductor surface, and a backside semiconductor surface. The topside semiconductor surface, bevel semiconductor surface and the backside semiconductor surface generally include silicon or germanium. Step 102 comprises forming a metal comprising gate dielectric layer on at least the topside semiconductor surface and on at least a portion of the bevel semiconductor surface and the backside semiconductor surface. The metal comprising gate dielectric layer generally provides a k-value>10. Exemplary metal comprising high-k dielectrics include hafnium oxide, hafnium silicon oxide, hafnium silicon oxynitride, lanthanum oxide, zirconium oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. The gate dielectric can comprise both Hf and Zr. In one particular embodiment of the invention the Hf comprising gate dielectric layer comprises 1 nm to 5 nm of HfSiON, wherein the HfSiON comprises 30 to 60 at. % $SiO_2$ and 2 to 20 at. % N with the balance being HfO. HfSiON can be formed by nitridizing HfSiO.

Step 103 comprises selectively removing the metal comprising gate dielectric layer on the bevel semiconductor surface and the backside semiconductor surface while protecting the metal comprising gate dielectric layer on the topside semiconductor surface. The selective removing can be preformed by flipping the wafer so that it is oriented backside up and etching the backside and bevel in a single wafer spray etch tool having a spray nozzle. The spray etch tool can avoid the need to add a protective layer on the frontside of the wafer to protect the metal comprising gate dielectric layer on the frontside of the wafer. Although described using a spray etch tool, by adding a protective layer to protect the metal comprising gate dielectric layer on the frontside of the wafer, conventional etch baths may also generally be used.

The selective removing step 103 comprises at least two steps 103a and 103b which both protect the metal comprising gate dielectric layer on the topside semiconductor surface, where step 103b occurs after step 103a. Step 103a comprises a first oxidizing treatment. The first oxidizing treatment can comprise exposing the bevel semiconductor surface and backside semiconductor surface to a wet chemistry oxidation including at least one oxidizer such as nitric acid, nitrous acid, peroxonitric acid, hyponitrous acid, perchloric acid, phosphoric acid, peroxophosphoric acid, oxalic acid, peroxosulfuric acid, sulfurous acid, and hydrogen peroxide (e.g. SC1 which comprises ammonium hydroxide and hydrogen peroxide).

Step 103b comprises a fluoride comprising wet etch. The fluoride can comprise hydrogen fluoride (HF), ammonium fluoride, tetramethylammonium fluoride, ammonium hydrogen fluoride, fluorboric acid or tetramethylammonium tetrafluoroborate. In one particular embodiment of the invention the first oxidizing treatment (step 103(a)) consists essentially of concentrated nitric acid and the fluoride comprising wet etch (step 103(b)) consists essentially of concentrated HF.

Step 104 comprises completing fabrication of the IC generally including conventional steps including metal gate electrode formation (e.g. metal electrode and a barrier metal), source drain formation, metallization and passivation processing. In one embodiment, the gate electrode material comprises a metal that forms a silicide with silicon, such as a refractory metal, for example, W or Ta.

Figure 2:
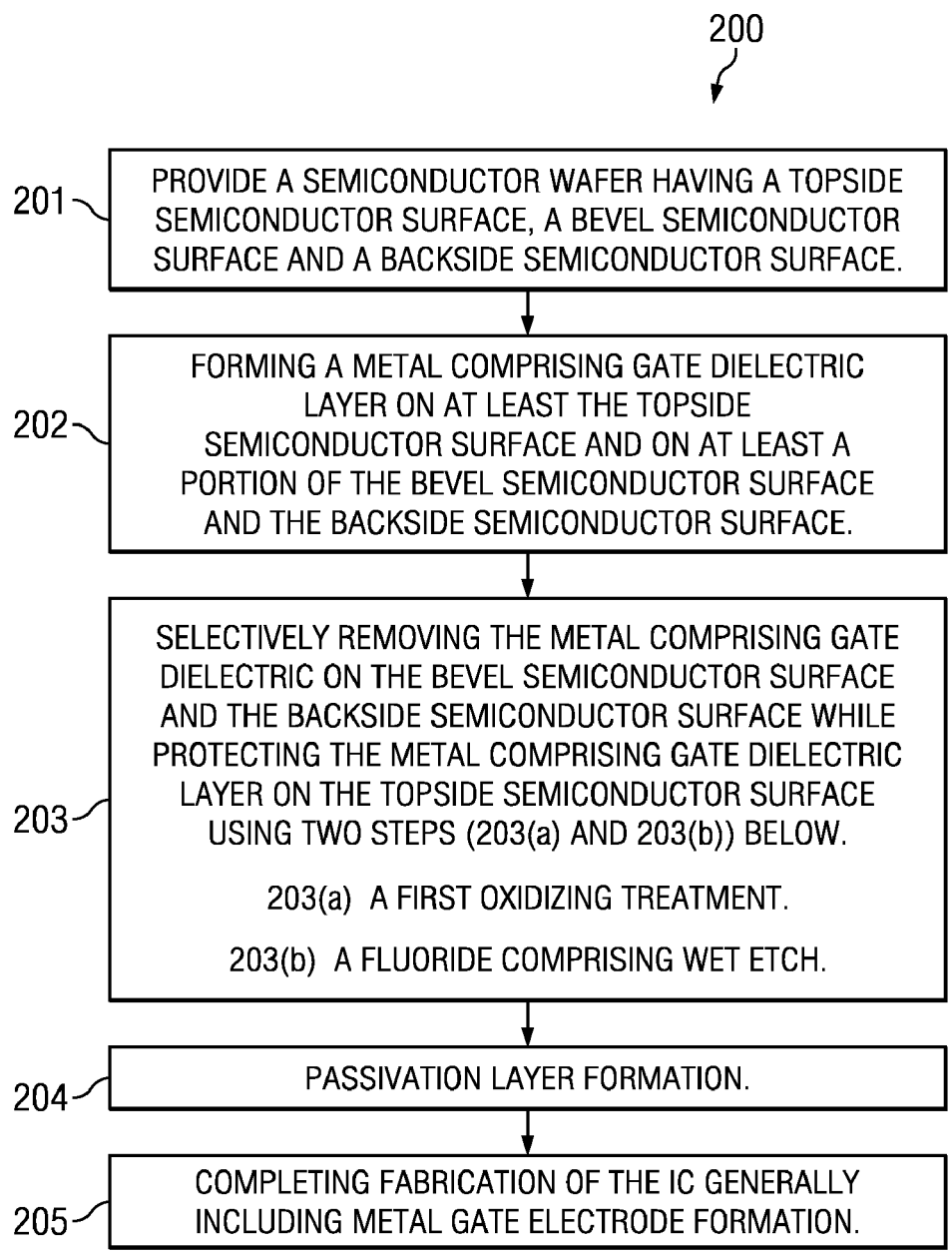
FIG. 2 shows a flow diagram for a second method for fabricating a CMOS IC including removing a high-k metal comprising dielectric material from the back semiconductor surface and bevel semiconductor of a wafer, followed by forming an oxide comprising passivation layer on the backside semiconductor surface and the bevel semiconductor surface of the wafer, according to a second embodiment of the invention.

FIG. 2 shows a flow diagram for a second method 200 for fabricating a CMOS IC including the steps described above for method 100, with steps 101-103(b) renumbered 201-203(b), with an additional passivation layer formation step 204 on the backside and bevel of the wafer sufficient to render the backside and bevel of the wafer hydrophobic. As known in the art, a hydrophobic surface beads off water. The Present Inventors have found that a passivated Si or Ge surface prevents subsequently deposited films, such as refractory metal comprising materials used for the gate electrode stack, from interacting with the silicon or germanium surface and forming silicon or germanium metal arrangements (e.g. forming silicides in the case of silicon). By preventing substrate comprising materials such as silicides from forming using a passivated surface, gentler subsequent clean steps can be used which result in little or no backside semiconductor etching (e.g. a typical silicon etch comprising using $HNO_3$ plus HF) that due to its non-uniformity can adversely impact wafer flatness. Poor wafer flatness is known in the art to adversely impact subsequent photolithographic processing.

The passivation layer can be formed using a variety of methods. One method comprises an oxidizing furnace or a plasma furnace, such as an asher operated using an oxidizing plasma. Another method comprises a chemical oxidation using an oxidizing solution for growing a silicon oxide layer on the backside and bevel of the wafer, such as using the oxidizers listed above in the description of step 103(a). A single wafer spray tool with a flipping mechanism can be used for this purpose to eliminate the need to protect the frontside of the wafer. Yet another method comprises forming a room temperature or near room temperature (e.g. 20 to 50° C., such as 20 to 35° C.) relatively thick "native oxide" layer in the ambient air by allowing the native oxide to grow for $\geq 12$ hours. The resulting silicon oxide layer in the case of a silicon substrate is a low density silicon oxide layer that is generally at least 10 to 15 Angstroms thick, which compares to a conventional native oxide layer that generally results from several hours in air (e.g. a fractional portion of a factory shift) that is no more than about 8 Angstroms thick, such as 6 to 8 Angstroms thick.

In the case step 204 comprises wet chemistry oxidation to form the passivation layer the selective removing step 203, can be performed while the wafer remains flipped so that its backside is oriented up so that a chemical oxide grows on the backside and the bevel surfaces while in the spray etch tool, so that the topside semiconductor surface is not affected by the chemical oxidation step. As described above, the wet chemistry oxidizing treatment can utilize nitric acid, nitrous acid, peroxonitric acid, hyponitrous acid, perchloric acid, peroxophosphoric acid, oxalic acid, peroxosulfuric acid, sulfurous acid, and hydrogen peroxide. Step 205 is analogous to step 104 and comprises completing fabrication of the IC including metal gate electrode formation.

EXAMPLES

The following non-limiting Examples serve to illustrate selected embodiments of the invention. It will be appreciated that variations in proportions and alternatives in elements of the components shown will be apparent to those skilled in the art and are within the scope of embodiments of the present invention.

A HfSiON comprising dielectric about 2.5 nm thick comprising (by weight) 30% silica, 14% N, was formed on the topside, bevel and backside of a silicon wafer by depositing HfSiO followed by plasma nitridation. A wet chemical clean was performed in a spray tool comprising 10 to 20 seconds of concentrated nitric acid at 45° C. followed by 10 to 20 seconds of hydrofluoric acid at 25° C. Vapor phase decomposition-droplet collection-inductively coupled mass spectroscopy (VPD-DC-ICPMS) was used to measure the residual Hf concentration on the backside and bevel of the wafer following the wet chemical clean. The front end of the line (FEOL) specification limit for residual Hf was $1\times10^{10}$ atoms/cm$^2$. Measurements obtained were no higher than $4\times10^9$ Hf atoms/cm$^2$ from the VPD-DC-ICPMS which is generally below the detection limit for this measurement instrument which is about $5\times10^7$ atoms/cm$^2$ for Hf, thus evidencing essentially complete Hf removal from the backside and bevel of the wafer.

Following the wet chemical sequence described above, while still being flipped in the same spray tool, the wafers were exposed to a wet chemical oxidation step consisting essentially of concentrated nitric acid at 45° C. to form a passivating oxide layer. Metal electrode deposition comprising W followed by barrier metal deposition processing comprising Ta or TaN was then performed. Control wafers did not receive the wet chemical oxidation step. The backside of the control wafers was found to include W and Ta concentrations of about $10^{12}$ to $10^{14}$ atoms/cm$^2$, thus requiring an aggressive etch such as HF/HNO$_3$ to remove the metal from the backside and bevel of the wafer to reduce the residual metal levels to below the FEOL limit. As described above, aggressive etches such as HF/HNO$_3$ generally significantly etch the semiconductor (e.g. Si), generally in a non-uniform manner. The wafers that received the passivating oxide layer according to an embodiment of the invention were found to have metal concentrations at backside and bevel surfaces of the wafer generally well below the FEOL specification limit of $1\times10^{10}$ atoms/cm$^2$ for both W and Ta, and thus did not require the HF/HNO$_3$ clean to remove residual metal that can result in loss of wafer flatness.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method for fabricating a CMOS integrated circuit (IC), comprising:
    providing a semiconductor wafer having a topside semiconductor surface, a bevel semiconductor surface, and a backside semiconductor surface, wherein said bevel surface and said backside surface comprises silicon or germanium;
    forming a metal comprising high-k gate dielectric layer on at least said topside semiconductor surface and on at least a portion of said bevel semiconductor surface and said backside semiconductor surface;
    selectively removing said high-k dielectric layer on said bevel semiconductor surface and said backside semiconductor surface while protecting said high-k dielectric layer on said topside semiconductor surface, said selective removing comprising:
    a first oxidizing treatment, and
    following said first oxidizing treatment, a fluoride comprising wet etch, and
    completing fabrication of said IC including forming at least one metal gate layer on said high-k gate dielectric layer after said selectively removing step.

2. The method of claim 1, wherein said first oxidizing treatment comprises exposing said bevel semiconductor surface and said backside semiconductor surface to at least one oxidizer selected from the group consisting of nitric acid, nitrous acid, peroxonitric acid, hyponitrous acid, perchloric acid, peroxophosphoric acid, oxalic acid, peroxosulfuric acid, sulfurous acid and hydrogen peroxide.

3. The method of claim 1, wherein said selective removing is performed in a single wafer spray etch tool having backside flipping, wherein said wafer is flipped during said selective removing to selectively expose said bevel semiconductor surface and said backside semiconductor surface to said first oxidizing treatment and said fluoride comprising wet etch.

4. The method of claim 1, wherein said first oxidizing treatment comprises exposing said bevel semiconductor surface and said backside semiconductor surface to nitric acid and said fluoride comprising wet etch comprises HF.

5. The method of claim 4, wherein said first oxidizing treatment consists essentially of concentrated nitric acid and said fluoride comprising wet etch consists essentially of concentrated HF.

6. The method of claim 1, further comprising the step of forming a passivation layer on said bevel semiconductor surface and said backside semiconductor surface after said fluoride comprising wet etch and before said forming said metal gate layer.

7. The method of claim 6, wherein said forming said passivation layer comprises processing in an oxidizing furnace or a plasma furnace.

8. The method of claim 6, wherein said forming said passivation layer comprises using an oxidizing solution for growing a silicon oxide layer on said backside semiconductor surface and said bevel semiconductor surface.

9. The method of claim 6, wherein said forming said passivation layer comprises forming an oxide layer at 20 to 35° C. on said backside semiconductor surface and said bevel semiconductor surface in ambient air for $\geqq 12$ hours.

10. The method of claim 1, wherein said high-k gate dielectric layer comprises Hf, Zr or Hf and Zr.

11. A method for fabricating a CMOS integrated circuit (IC), comprising:
providing a semiconductor wafer having a topside silicon surface, a bevel silicon surface, and a backside silicon surface;
forming a Hf, Zr or HfZr comprising high-k gate dielectric layer on at least said topside semiconductor surface and on at least a portion of said bevel silicon surface and said backside silicon surface;
selectively removing said high-k dielectric layer on said bevel silicon surface and said backside silicon surface while protecting said high-k dielectric layer on said topside silicon surface, said selective removing comprising:
a first wet chemistry oxidizing acid treatment consisting essentially of concentrated nitric acid, and
following said first oxidizing acid treatment, a fluoride comprising wet etch consisting essentially of concentrated HF, and
completing fabrication of said IC including forming at least one metal gate layer on said high-k gate dielectric layer after said selectively removing step.

12. The method of claim 11, wherein said selective removing is performed in a single wafer spray etch tool having backside flipping, wherein said wafer is processed while being flipped during said selective removing to selectively expose said bevel silicon surface and said backside silicon surface to said first wet oxidizing acid treatment and said fluoride comprising wet etch.

13. The method of claim 12, further comprising the step of forming a passivation layer on said bevel silicon surface and said backside silicon surface after said fluoride comprising wet etch in said single wafer spray etch tool.

14. The method of claim 13, wherein said forming a passivation layer comprises exposing said bevel silicon surface and said backside silicon surface to a solution consisting essentially of concentrated nitric acid.

15. The method of claim 14, wherein said exposing is for 10 to 30 seconds at 35 to 55° C.

16. The method of claim 11, wherein said high-k gate dielectric layer comprises a Hf comprising gate dielectric layer comprising 1 nm to 5 nm of HfSiON, said HfSiON comprising 30 to 60 at. % $SiO_2$ and 2 to 20 at % N.

17. The method of claim 11, wherein a time for said first wet chemistry oxidizing acid treatment is from 10 to 30 seconds at 35 to 55° C. and said fluoride comprising wet etch step is from 10 to 30 seconds at 22 to 30° C.

\* \* \* \* \*